(12) United States Patent
Shin et al.

(10) Patent No.: US 12,256,616 B2
(45) Date of Patent: Mar. 18, 2025

(54) DISPLAY DEVICE AND METHOD OF MANUFACTURING DISPLAY DEVICE

(71) Applicant: Samsung Display Co., Ltd., Yongin-si (KR)

(72) Inventors: Hyuneok Shin, Gwacheon-si (KR); Hyunwoo Kang, Yeosu-si (KR); Hyunah Sung, Suwon-si (KR); Dokeun Song, Yongin-si (KR); Sukyoung Yang, Hwaseong-si (KR); Yunjong Yeo, Hwaseong-si (KR); Dongmin Lee, Anyang-si (KR); Donghyeok Lee, Yongin-si (KR); Shin Il Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/441,694

(22) Filed: Feb. 14, 2024

(65) Prior Publication Data
US 2024/0224679 A1    Jul. 4, 2024

Related U.S. Application Data

(62) Division of application No. 17/398,336, filed on Aug. 10, 2021, now Pat. No. 11,943,982.

(30) Foreign Application Priority Data

Nov. 18, 2020 (KR) ........................ 10-2020-0154473

(51) Int. Cl.
*H10K 59/131* (2023.01)
*H10K 59/12* (2023.01)

(52) U.S. Cl.
CPC ..... *H10K 59/1315* (2023.02); *H10K 59/1201* (2023.02)

(58) Field of Classification Search
CPC ....................... H10K 59/1315; H10K 59/1201
(Continued)

(56) References Cited

U.S. PATENT DOCUMENTS

| 9,373,671 B2 | 6/2016 | You |
| 9,733,538 B2 | 8/2017 | Ogasawara et al. |

(Continued)

FOREIGN PATENT DOCUMENTS

| KR | 100812473 B1 | 3/2008 |
| KR | 100946809 B1 | 3/2010 |

(Continued)

OTHER PUBLICATIONS

Extended European Search Report for Application No. 21205834.1-1020 dated Apr. 7, 2022.

*Primary Examiner* — Xia L Cross
(74) *Attorney, Agent, or Firm* — CANTOR COLBURN LLP

(57) ABSTRACT

A display device includes an active layer in a display area, a first gate insulation layer on the active layer, a first gate line on the first gate insulation layer in the display area, a first signal line in the same layer as the first gate line in a non-display area and including the same material as that of the first gate line including molybdenum, a second gate insulation layer on the first gate line and the first signal line, a second gate line on the second gate insulation layer in the display area, and a second signal line in the same layer as the second gate line in the non-display area and including the same material as that of the second gate line including aluminum or an aluminum alloy. A width of the first signal line is greater than a width of the second signal line.

4 Claims, 16 Drawing Sheets

(58) Field of Classification Search
USPC .......................................................... 257/40
See application file for complete search history.

(56) References Cited

U.S. PATENT DOCUMENTS

| | | |
|---|---|---|
| 10,461,140 B2 | 10/2019 | Udagawa et al. |
| 2014/0342478 A1 | 11/2014 | Choi |
| 2017/0279084 A1 | 9/2017 | Sakamoto et al. |
| 2019/0164995 A1* | 5/2019 | Lee ...................... H10K 77/111 |
| 2019/0181198 A1* | 6/2019 | Son ....................... H01L 27/124 |
| 2020/0066758 A1 | 2/2020 | Yang et al. |
| 2020/0105799 A1 | 4/2020 | Yuan |
| 2020/0152663 A1 | 5/2020 | Li et al. |
| 2021/0191552 A1 | 6/2021 | Bok et al. |
| 2021/0202656 A1 | 7/2021 | Ka et al. |
| 2021/0280666 A1 | 9/2021 | Sohn et al. |

FOREIGN PATENT DOCUMENTS

| | | |
|---|---|---|
| KR | 1020150092814 A | 8/2015 |
| KR | 1020150108460 A | 9/2015 |
| KR | 1020160021389 A | 2/2016 |
| KR | 1020160034530 A | 3/2016 |
| KR | 1020190132603 A | 11/2019 |
| WO | 2020004746 A1 | 1/2020 |

\* cited by examiner

DISPLAY DEVICE AND METHOD OF MANUFACTURING DISPLAY DEVICE

This application is a divisional of U.S. patent application Ser. No. 17/398,336, filed on Aug. 10, 2021, which claims priority to Korean Patent Application No. 10-2020-0154473, filed on Nov. 18, 2020, and all the benefits accruing therefrom under 35 U.S.C. § 119, the content of which in its entirety is herein incorporated by reference.

BACKGROUND

1. Field

Embodiments relate to a display device. More particularly, embodiments relate to a display device including wirings and a method of manufacturing the display device.

2. Description of the Related Art

As a display field for visually expressing various electrical signals develops rapidly, various flat panel display devices having excellent characteristics such as reduction in thickness, light weight, low power consumption, etc., are used. Among the flat panel display devices, a liquid crystal display device and an organic light emitting display device are widely commercialized because of their excellent resolution and image quality. Specifically, the organic light emitting display device is drawing attention as a next-generation flat panel display device because of advantages such as fast response speed, low power consumption, and excellent viewing angle.

SUMMARY

A display device may include lines transmitting various signals for displaying an image. In this regard, it may be desired to prevent damage to the lines in a process of manufacturing the display device, or to prevent a delay in a signal transmitted by the lines or deterioration of element characteristics due to the lines.

Embodiments provide a display device including a line having high heat resistance to improve element characteristics.

Embodiments provide a method of manufacturing a display device for preventing a line from being damaged.

A display device including a display area and a non-display area surrounding at least a portion of the display area in an embodiment includes a base substrate, a buffer layer disposed on the base substrate, an active layer disposed on the buffer layer in the display area, a first gate insulation layer disposed on the active layer, a first gate line disposed on the first gate insulation layer in the display area, a first signal line disposed in a same layer as the first gate line in the non-display area, the first signal line including a same material as a material of the first gate line including molybdenum, a second gate insulation layer disposed on the first gate line and the first signal line, a second gate line disposed on the second gate insulation layer in the display area, and a second signal line disposed in a same layer as the second gate line in the non-display area, the second signal line including a same material as a material of the second gate line including aluminum or an aluminum alloy. A width of the first signal line is greater than a width of the second signal line.

In an embodiment, the display device may further include an insulation interlayer disposed on the second gate line and the second signal line and a conductive line disposed on the insulation interlayer in the display area, the conductive line including aluminum and titanium. The conductive line may directly contact the second gate line through a second gate contact hole defined in the insulation interlayer.

In an embodiment, the display device may further include a planarization layer disposed on the conductive line, a first electrode disposed on the planarization layer in the display area, an emission layer disposed on the first electrode, and a second electrode disposed on the emission layer.

In an embodiment, the first signal line may transmit a signal applied to at least one of the first gate line, the second gate line, and the conductive line.

In an embodiment, the second gate line may include a first layer including aluminum or an aluminum alloy and a second layer disposed on the first layer and including one of titanium and titanium nitride.

In an embodiment, the second gate line may further include a third layer disposed on the second layer and including titanium or titanium nitride.

In an embodiment, the second layer may include one of titanium and titanium nitride, and the third layer may include another one of titanium and titanium nitride.

In an embodiment, the active layer may include polycrystalline silicon.

In an embodiment, the display device may further include a bendable area disposed in the non-display area. A first opening overlapping the bendable area may be defined in the second gate insulation layer, the first gate insulation layer, and a first portion of the buffer layer. A second opening overlapping the bendable area may be defined in a second portion of the buffer layer and a portion of the base substrate.

In an embodiment, the base substrate may include a first organic layer, a first barrier layer disposed on the first organic layer, a second organic layer disposed on the first barrier layer, and a second barrier layer disposed on the second organic layer. The buffer layer may include a first buffer layer disposed on the base substrate and including silicon oxide and a second buffer layer disposed on the first buffer layer and including silicon nitride.

In an embodiment, the first portion of the buffer layer may be the second buffer layer, and the second portion of the buffer layer may be the first buffer layer. The portion of the base substrate may be the second barrier layer.

In an embodiment, a width of the first opening may be greater than a width of the second opening.

A display device including a display area and a non-display area surrounding at least a portion of the display area in an embodiment includes a base substrate, a buffer layer disposed on the base substrate, an active layer disposed on the buffer layer in the display area, a first gate insulation layer disposed on the active layer, a first gate line disposed on the first gate insulation layer in the display area, the first gate line including molybdenum, a second gate insulation layer disposed on the first gate line, a second gate line disposed on the second gate insulation layer in the display area, the second gate line including aluminum or an aluminum alloy, an insulation interlayer disposed on the second gate line, a conductive line disposed on the insulation interlayer in the display area, and a signal line disposed in a same layer as the conductive line in the non-display area, the signal line including a same material as a material of the conductive line including aluminum and titanium. The signal line transmits a signal applied to at least one of the first gate line, the second gate line, and the conductive line.

In an embodiment, the conductive line may directly contact the second gate line through a second gate contact hole defined in the insulation interlayer.

In an embodiment, a thickness of the second gate line may be less than a thickness of the first gate line.

In an embodiment, an electrical resistance of the second gate line may be substantially equal to an electrical resistance of the first gate line.

A method of manufacturing a display device in an embodiment includes forming a buffer layer on a base substrate, forming an active layer on the buffer layer, forming a first gate insulation layer on the active layer, forming a first gate line on the first gate insulation layer, the first gate line including molybdenum, forming a second gate insulation layer on the first gate line, forming a second gate line on the second gate insulation layer, the second gate line including aluminum or an aluminum alloy, forming an insulation interlayer on the second gate line, simultaneously defining an active contact hole that exposes the active layer in the insulation interlayer, the second gate insulation layer, and the first gate insulation layer, a first gate contact hole that exposes the first gate line in the insulation interlayer and the second gate insulation layer, and a first opening that overlaps a bendable area in the insulation interlayer, the second gate insulation layer, the first gate insulation layer, and a first portion of the buffer layer, and simultaneously defining a second gate contact hole that exposes the second gate line in the insulation interlayer and a second opening that overlaps the bendable area in a second portion of the buffer layer and a portion of the base substrate.

In an embodiment, the method may further include after the simultaneously defining the active contact hole, the first gate contact hole, and the first opening and before the simultaneously defining the second gate contact hole and the second opening, heat-treating the active layer such that an oxide layer is formed on the active layer and removing the oxide layer formed on the active layer by the heat-treatment.

In an embodiment, the oxide layer may be removed by a buffered oxide etchant or hydrogen fluoride.

In an embodiment, the method may further include forming a conductive line on the insulation interlayer, the conductive line including aluminum and titanium. The conductive line may be connected to the active layer through the active contact hole, may directly contact the first gate line through the first gate contact hole, and may directly contact the second gate line through the second gate contact hole.

In the display device in the embodiments, the first gate line may include molybdenum (Mo), and the second gate line may include aluminum (Al), so that heat resistance of the first and second gate lines may increase, and electrical characteristics of a thin film transistor may be improved. Further, the width of the first signal line disposed in the same layer as the first gate line, including the same material as that of the first gate line, and transmitting a signal may be greater than the width of the second signal line disposed in the same layer as the second gate line and including the same material as that of the second gate line, or the third signal line disposed in the same layer as the conductive line that includes aluminum and titanium and including the same material as that of the conductive line may transmit a signal, so that a signal delay may be prevented.

In the method of manufacturing the display device in the embodiments, the second gate contact hole may be defined after forming the active contact hole and the first gate contact hole, so that the second gate line may not be damaged in the process of forming the active contact hole and the first and second gate contact holes.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
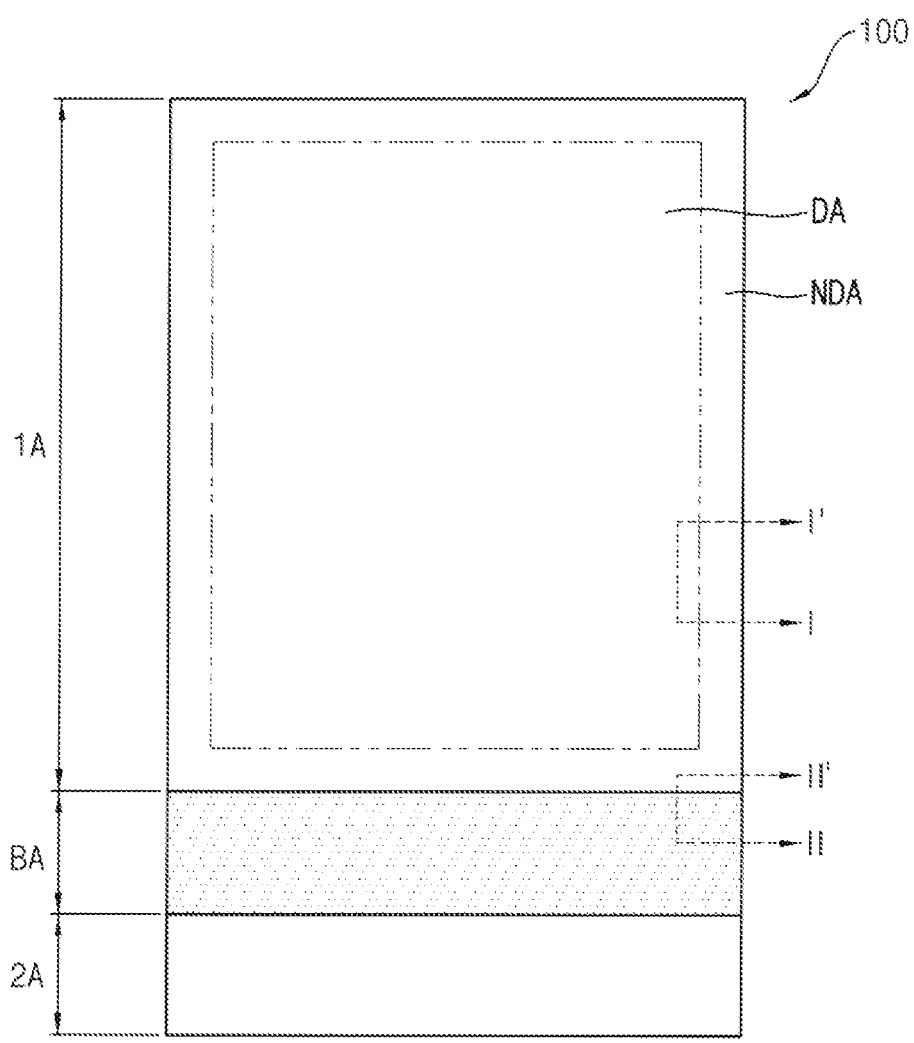
FIG. 1 is a plan view illustrating an embodiment of a display device.

Hereinafter, display devices and methods of manufacturing display devices in embodiments will be explained in detail with reference to the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, a display device in an embodiment will be described with reference to FIGS. 1 to 5.

FIG. 1 is a plan view illustrating an embodiment of a display device.

Referring to FIG. 1, a display device 100 may include a display area DA and a non-display area NDA. Pixels for emitting light may be disposed in the display area DA.

The non-display area NDA may surround at least a portion of the display area DA. In an embodiment, the non-display area NDA may entirely surround the display area DA. Drivers providing control signals to the pixels and pads providing signals to the pixels and connected to an integrated circuit, a printed circuit board, etc., may be disposed in the non-display area NDA.

In an embodiment, the display device 100 may divided into a first area 1A, a second area 2A, and a bendable area BA. The second area 2A may be spaced apart from the first area 1A. The bendable area BA may be disposed between the first area 1A and the second area 2A. The bendable area BA may be bent. In an embodiment, the bendable area BA may be bent such that the first area 1A and the second area 2A face each other.

In an embodiment, the display area DA may be disposed inside the first area 1A, and the non-display area NDA may include a portion of the first area 1A other than the display area DA, the second area 2A, and the bendable area BA. In an embodiment, the drivers may be disposed in the portion of the first area 1A other than the display area DA, the pads may be disposed in the second area 2A, and wirings connecting the pixels and the pads may be disposed in the bendable area BA, for example.

Figure 2:
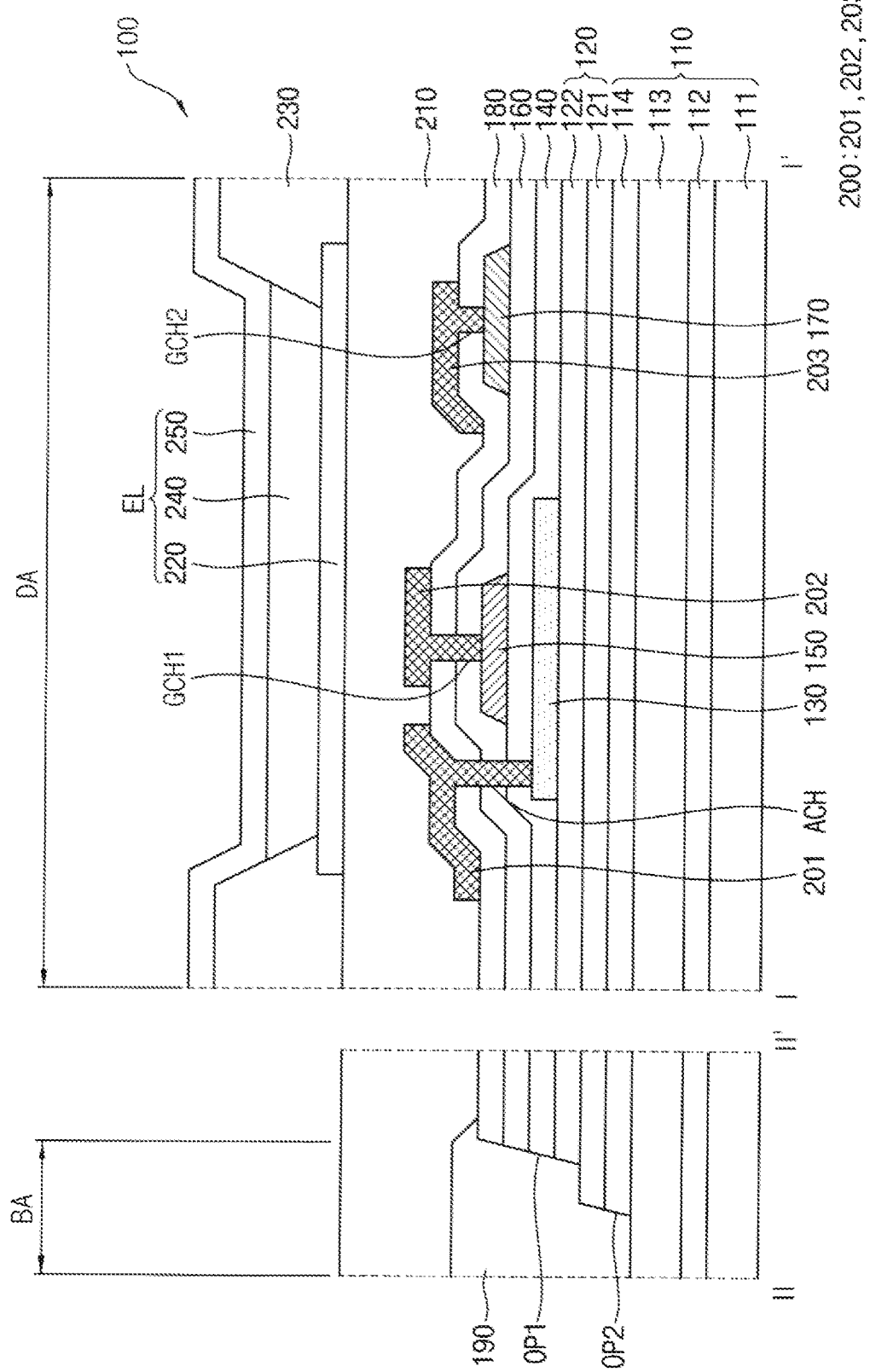
FIG. 2 is a cross-sectional view illustrating an embodiment of the display device taken along line I-I' and line II-II' in FIG. 1.

FIG. 2 is a cross-sectional view illustrating an embodiment of the display device 100 taken along line I-I' and line II-II' in FIG. 1.

Referring to FIG. 2, the display device 100 may include a base substrate 110, a buffer layer 120, an active layer 130, a first gate insulation layer 140, a first gate line 150, a second gate insulation layer 160, a second gate line 170, an inter-insulation layer 180, a stress relaxation layer 190, a conductive line 200, a planarization layer 210, a first electrode 220, a pixel defining layer 230, an emission layer 240, and a second electrode 250.

In an embodiment, the base substrate 110 may be a flexible substrate. In an embodiment, the base substrate 110 may include an organic material. In such an embodiment, the display device 100 may be a flexible display device, for example.

In an embodiment, the base substrate 110 may include a first organic layer 111, a first barrier layer 112, a second organic layer 113, and a second barrier layer 114. The first barrier layer 112 may be disposed on the first organic layer 111. The second organic layer 113 may be disposed on the first barrier layer 112. The second barrier layer 114 may be disposed on the second organic layer 113.

Each of the first organic layer 111 and the second organic layer 113 may include an organic material such as a photo-resist, polyacrylic resin, polyimide resin, polyamide resin, siloxane resin, acrylic resin, epoxy resin, or the like. In an embodiment, the polyimide resin may be a random copolymer or a block copolymer, for example.

Each of the first barrier layer 112 and the second barrier layer 114 may include an inorganic material such as a silicon compound, a metal oxide, or the like. In an embodiment, each of the first barrier layer 112 and the second barrier layer 114 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), or the like, for example.

Since the base substrate 110 includes the first organic layer 111 and the second organic layer 113, the base substrate 110 may have a flexible characteristic. Further, the first barrier layer 112 and the second barrier layer 114 may block moisture penetrating through the first organic layer 111 and the second organic layer 113.

The buffer layer 120 may be disposed on the base substrate 110. The buffer layer 120 may planarize over the base substrate 110, and may block impurities from flowing into the active layer 130 from the base substrate 110 in a process of heat-treating the active layer 130.

The buffer layer 120 may include a plurality of layers. In an embodiment, the buffer layer 120 may include a first buffer layer 121 and a second buffer layer 122. The second buffer layer 122 may be disposed on the first buffer layer 121. In an embodiment, the first buffer layer 121 may include silicon oxide ($SiO_x$). In an embodiment, the second buffer layer 122 may include silicon nitride ($SiN_x$).

The active layer 130 may be disposed on the buffer layer 120 in the display area DA. In an embodiment, the active layer 130 may include polycrystalline silicon. However, the invention is not limited thereto, and in another embodiment, the active layer 130 may include amorphous silicon, an oxide semiconductor, or the like.

The active layer 130 may include a source region, a drain region, and a channel region. The drain region may be spaced apart from the source region. The channel region may be disposed between the source region and the drain region. Impurities may be doped into the source region and the drain region.

The first gate insulation layer 140 may be disposed on the active layer 130. The first gate insulation layer 140 may cover the active layer 130, and may be disposed on the buffer layer 120. The first gate insulation layer 140 may include an inorganic material such as a silicon compound, a metal oxide, or the like. In an embodiment, the first gate insulation layer 140 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), or the like, for example.

The first gate line 150 may be disposed on the first gate insulation layer 140 in the display area DA. A portion of the first gate line 150 may overlap the channel region of the active layer 130. In an embodiment, the first gate line 150 may transmit a scan signal. The active layer 130 and the first gate line 150 may form at least one thin film transistor ("TFT").

In an embodiment, the first gate line 150 may include molybdenum (Mo). In an embodiment, when the first gate line 150 includes aluminum (Al), a void defect may occur in the first gate line 150 due to a high temperature process performed during the manufacturing process of the display device 100. In an embodiment, when the first gate line 150 is provided as a multilayer including a layer including aluminum (Al) and a capping layer including titanium (Ti) or titanium nitride (TiN), the first gate line 150 may block dispersion of hydrogen, and thus, hydrogen inflow into the active layer 130 or hydrogen outflow from the active layer 130 may decrease. In this case, a driving range of the TFT may decrease, and an instantaneous afterimage of the display device 100 may increase.

The second gate insulation layer 160 may be disposed on the first gate line 150. The second gate insulation layer 160 may cover the first gate line 150, and may be disposed on the first gate insulation layer 140. The second gate insulation layer 160 may include an inorganic material such as a silicon compound, a metal oxide, or the like. In an embodiment, the second gate insulation layer 160 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), or the like, for example.

The second gate line 170 may be disposed on the second gate insulation layer 160 in the display area DA. Although it is not illustrated in FIG. 2, a portion of the second gate line 170 may overlap the channel region of the active layer 130. The active layer 130 and the second gate line 170 may form at least one TFT. Further, the first gate line 150 and the second gate line 170 may form at least one capacitor.

In an embodiment, the second gate line 170 may include aluminum (Al) or aluminum alloy. In an embodiment, when the second gate line 170 includes molybdenum (Mo), a stress applied to the second gate line 170 may increase due to external impact, and accordingly, a crack defect may occur in the second gate line 170.

Figure 3:
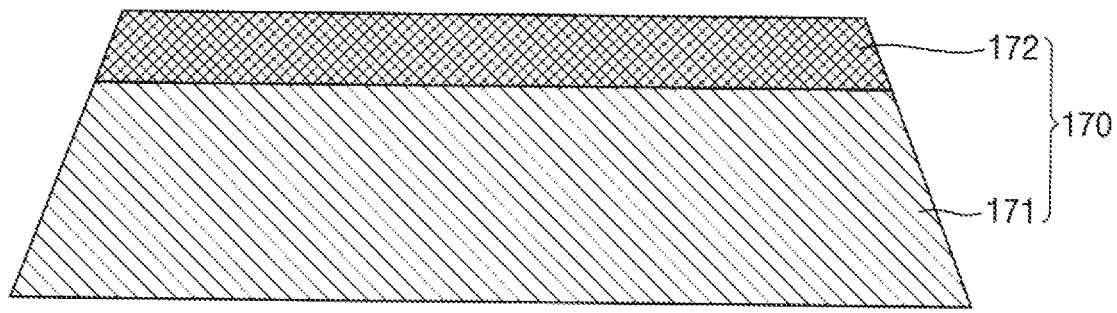
FIG. 3 is a cross-sectional view illustrating an embodiment of a second gate line in FIG. 2.

FIG. 3 is a cross-sectional view illustrating an embodiment of the second gate line 170 in FIG. 2.

Referring to FIG. 3, in an embodiment, the second gate line 170 may include a first layer 171 and a second layer 172 disposed on the first layer 171. In such an embodiment, the second gate line 170 may have a multilayer structure including two conductive layers.

In an embodiment, the first layer 171 may include aluminum (Al) or aluminum alloy. In an embodiment, the second layer 172 may include titanium (Ti) or titanium nitride (TiN).

In an embodiment, a thickness of the second layer 172 may be less than a thickness of the first layer 171. In an embodiment, the thickness of the first layer 171 may be about 1500 angstroms (Å) to about 3000 Å, and the thickness of the second layer 172 may be about 300 Å, for example. In such an embodiment, the first layer 171 may serve as a main conductive layer of the second gate line 170, and the second layer 172 may serve as a capping layer for protecting the first layer 171.

Figure 4:
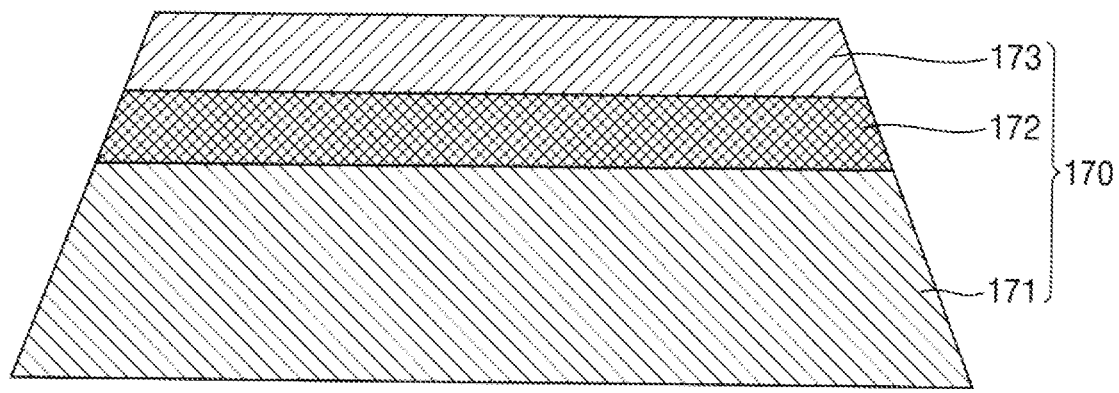
FIG. 4 is a cross-sectional view illustrating another embodiment of a second gate line in FIG. 2.

FIG. 4 is a cross-sectional view illustrating another embodiment of the second gate line 170 in FIG. 2.

Referring to FIG. 4, in an embodiment, the second gate line 170 may include a first layer 171, a second layer 172 disposed on the first layer 171, and a third layer 173 disposed on the second layer 172. In such an embodiment, the second gate line 170 may have a multilayer structure including three conductive layers.

In an embodiment, the first layer 171 may include aluminum (Al) or aluminum alloy. In an embodiment, the second layer 172 may include titanium (Ti) or titanium nitride (TiN). The third layer 173 may include titanium (Ti) or titanium nitride (TiN).

In an embodiment, the second layer 172 may include one of titanium (Ti) and titanium nitride (TiN), and the third layer 173 may include another one of titanium (Ti) and titanium nitride (TiN). In an embodiment, the third layer 173 may include titanium nitride (TiN) when the second layer 172 includes titanium (Ti), and the third layer 173 may include titanium (Ti) when the second layer 172 includes titanium nitride (TiN), for example.

In an embodiment, a thickness of the second layer 172 and a thickness of the third layer 173 may be less than a thickness of the first layer 171 in a thickness direction (e.g., vertical direction in FIG. 4). In such an embodiment, the first layer 171 may serve as a main conductive layer of the second gate line 170, and each of the second layer 172 and the third layer 173 may serve as a capping layer for protecting the first layer 171.

Referring to FIG. 2 again, the insulation interlayer 180 may be disposed on the second gate line 170. The insulation interlayer 180 may cover the second gate line 170, and may be disposed on the second gate insulation layer 160. The insulation interlayer 180 may include an inorganic material such as a silicon compound, a metal oxide, or the like. In an embodiment, the insulation interlayer 180 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), or the like, for example.

An active contact hole ACH may be defined in the insulation interlayer 180, the second gate insulation layer 160, and the first gate insulation layer 140. The active contact hole ACH may pass through the insulation interlayer 180, the second gate insulation layer 160, and the first gate insulation layer 140, and may expose the active layer 130. In an embodiment, the active contact hole ACH may expose the source region or the drain region of the active layer 130, for example.

A first gate contact hole GCH1 may be defined in the insulation interlayer 180 and the second gate insulation layer 160. The first gate contact hole GCH1 may pass through the insulation interlayer 180 and the second gate insulation layer 160, and may expose the first gate line 150.

A second gate contact hole GCH2 may be defined in the insulation interlayer 180. The second gate contact hole GCH2 may pass through the insulation interlayer 180, and may expose the second gate line 170.

A first opening OP1 may be defined in the insulation interlayer 180, the second gate insulation layer 160, the first gate insulation layer 140, and a first portion of the buffer layer 120. The first opening OP1 may overlap the bendable area BA.

In an embodiment, the active contact hole ACH, the first gate contact hole GCH1, and the first opening OP1 may be substantially simultaneously defined. The formation of the active contact hole ACH, the first gate contact hole GCH1, and the first opening OP1 will be described with reference to FIGS. 9 to 15 below.

In an embodiment, the first portion of the buffer layer 120 may be the second buffer layer 122. In other words, the first opening OP1 may be defined in the insulation interlayer 180, the second gate insulation layer 160, the first gate insulation layer 140, and the second buffer layer 122.

A second opening OP2 may be defined in a second portion of the buffer layer 120 and a portion of the base substrate 110. The second opening OP2 may overlap the bendable area BA. The second portion of the buffer layer 120 may be a portion of the buffer layer 120 other than the first portion of the buffer layer 120.

In an embodiment, the second gate contact hole GCH2 and the second opening OP2 may be substantially simultaneously defined. The formation of the second gate contact hole GCH2 and the second opening OP2 will be described with reference to FIGS. 9 to 15 below.

In an embodiment, the second portion of the buffer layer 120 may be the first buffer layer 121, and the portion of the base substrate 110 may be the second barrier layer 114. In other words, the second opening OP2 may be defined in the first buffer layer 121 and the second barrier layer 114.

In an embodiment, a width of the first opening OP1 may be greater than a width of the second opening OP2 in a direction parallel to main plane extension direction (e.g., horizontal direction in FIG. 2). In such an embodiment, a lateral part of the second portion of the buffer layer 120 and the portion of the base substrate 110 exposed by the second opening OP2 may protrude from a lateral part of the insulation interlayer 180, the second gate insulation layer 160, the first gate insulation layer 140, and the first portion of the buffer layer 120. In an embodiment, a lateral part of the first buffer layer 121 may protrude from a lateral part of the second buffer layer 122, for example. Further, the first opening OP1 may expose an upper surface of the second portion of the buffer layer 120. In an embodiment, the first opening OP1 may expose an upper surface of the first buffer layer 121, for example.

The stress relaxation layer 190 may be disposed on the insulation interlayer 180 in the bendable area BA. The stress relaxation layer 190 may fill the first opening OP1 and the second opening OP2. The stress relaxation layer 190 may include an organic material such as a photoresist, a polyacrylic resin, a polyimide resin, a polyamide resin, a siloxane resin, an acrylic resin, an epoxy resin, or the like.

When a layered-structure is bent, a stress neutral plane may exist within the layered-structure. When the stress relaxation layer 190 does not exist, excessive tensile stress or the like may be applied to lines in the bendable area BA when the display device 100 is bent, because the positions of the lines may not correspond to the stress neutral plane. However, by disposing the stress relaxation layer 190 in the bendable area BA and adjusting the thickness and modulus of the stress relaxation layer 190, the position of the stress neutral plane in the layered-structure included in the display device 100 may be adjusted. Accordingly, the stress-neutral plane may be positioned in the vicinity of the lines due to the stress relaxation layer 190, thereby minimizing tensile stress applied to the lines.

The conductive line 200 may be disposed on the insulation interlayer 180 in the display area DA. In an embodiment, the conductive line 200 may include at least one of aluminum (Al) and titanium (Ti). In an embodiment, the conductive line 200 may have a multilayer structure including a titanium (Ti) layer, an aluminum (Al) layer, and a titanium (Ti) layer that are sequentially stacked. In such an embodiment, the aluminum (Al) layer may serve as a main conductive layer of the conductive line 200, and each of the titanium (Ti) layers may serve as a capping layer for protecting the aluminum (Al) layer.

The conductive line 200 may include a first conductive line 201, a second conductive line 202, and a third conductive line 203. The first conductive line 201 may be connected to the active layer 130 through the active contact hole ACH. In an embodiment, the first conductive line 201 may transmit a data voltage.

The second conductive line 202 may be connected to the first gate line 150 through the first gate contact hole GCH1. The third conductive line 203 may be connected to the second gate line 170 through the second gate contact hole GCH2. In an embodiment, the third conductive line 203 may transmit a first power voltage.

In an embodiment, the third conductive line 203 may directly contact the second gate line 170 through the second gate contact hole GCH2. In such an embodiment, corrosions of aluminum (Al) or titanium (Ti) may not exist on the second gate line 170 exposed by the second gate contact hole GCH2, and accordingly, the third conductive line 203 may directly contact the second gate line 170.

The planarization layer 210 may be disposed on the stress relaxation layer 190 and the conductive line 200. The planarization layer 210 may cover the stress relaxation layer 190 and the conductive line 200, and may be disposed on the insulation interlayer 180. The planarization layer 210 may include an organic material such as a photoresist, a polyacrylic resin, a polyimide resin, a polyamide resin, a siloxane resin, an acrylic resin, an epoxy resin, or the like.

The first electrode 220 may be disposed on the planarization layer 210 in the display area DA. The first electrode 220 may include a metal, an alloy, a metal nitride, a conductive metal oxide, a transparent conductive material, or the like. These may be used alone or in any combinations thereof. In an embodiment, the first electrode 220 may include silver (Ag), indium tin oxide ("ITO"), or the like, for example.

The pixel defining layer 230 may be disposed on the first electrode 220 in the display area DA. The pixel defining layer 230 may partially cover the first electrode 220, and may be disposed on the planarization layer 210. In an embodiment, an opening exposing a central portion of the first electrode 220 may be defined in the pixel defining layer 230, and the pixel defining layer 230 may cover a peripheral portion of the first electrode 220. The pixel defining layer 230 may include an organic material such as a photoresist, a polyacrylic resin, a polyimide resin, a polyamide resin, a siloxane resin, an acrylic resin, an epoxy resin, or the like.

The emission layer 240 may be disposed on the first electrode 220 in the opening of the pixel defining layer 230. The emission layer 240 may include at least one of an organic light emitting material and a quantum dot.

In an embodiment, the organic light emitting material may include a low molecular weight organic compound or a high molecular weight organic compound. In an embodiment, the low molecular weight organic compound may include copper phthalocyanine, N,N'-diphenylbenzidine, tris-(8-hydroxyquinoline)aluminum, or the like, and the high molecular organic compound may include poly(3,4-ethylenedioxythiophene), polyaniline, polyphenylenevinylene, polyfluorene, or the like, for example.

In an embodiment, the quantum dot may include a core including a group II-VI compound, a group III-V compound, a group IV-VI compound, a group IV element, a group IV compound, and combinations thereof. In an embodiment, the quantum dot may have a core-shell structure including a core and a shell surrounding the core. The shell may serve as a protective layer for maintaining semiconductor properties by preventing chemical modification of the core, and as a charging layer for imparting electrophoretic properties to the quantum dot.

The second electrode 250 may be disposed on the pixel defining layer 230 and the emission layer 240. The second electrode 250 may include a metal, an alloy, a metal nitride, a conductive metal oxide, a transparent conductive material, or the like. These may be used alone or in any combinations thereof. In an embodiment, the second electrode 250 may include aluminum (Al), platinum (Pt), silver (Ag), magnesium (Mg), gold (Au), chromium (Cr), tungsten (W), titanium (Ti), or the like, for example.

A second power voltage may be applied to the second electrode 250. In an embodiment, the second power voltage may be lower than the first power voltage. The first electrode 220, the emission layer 240, and the second electrode 250 may form a light emitting element EL.

Figure 5:
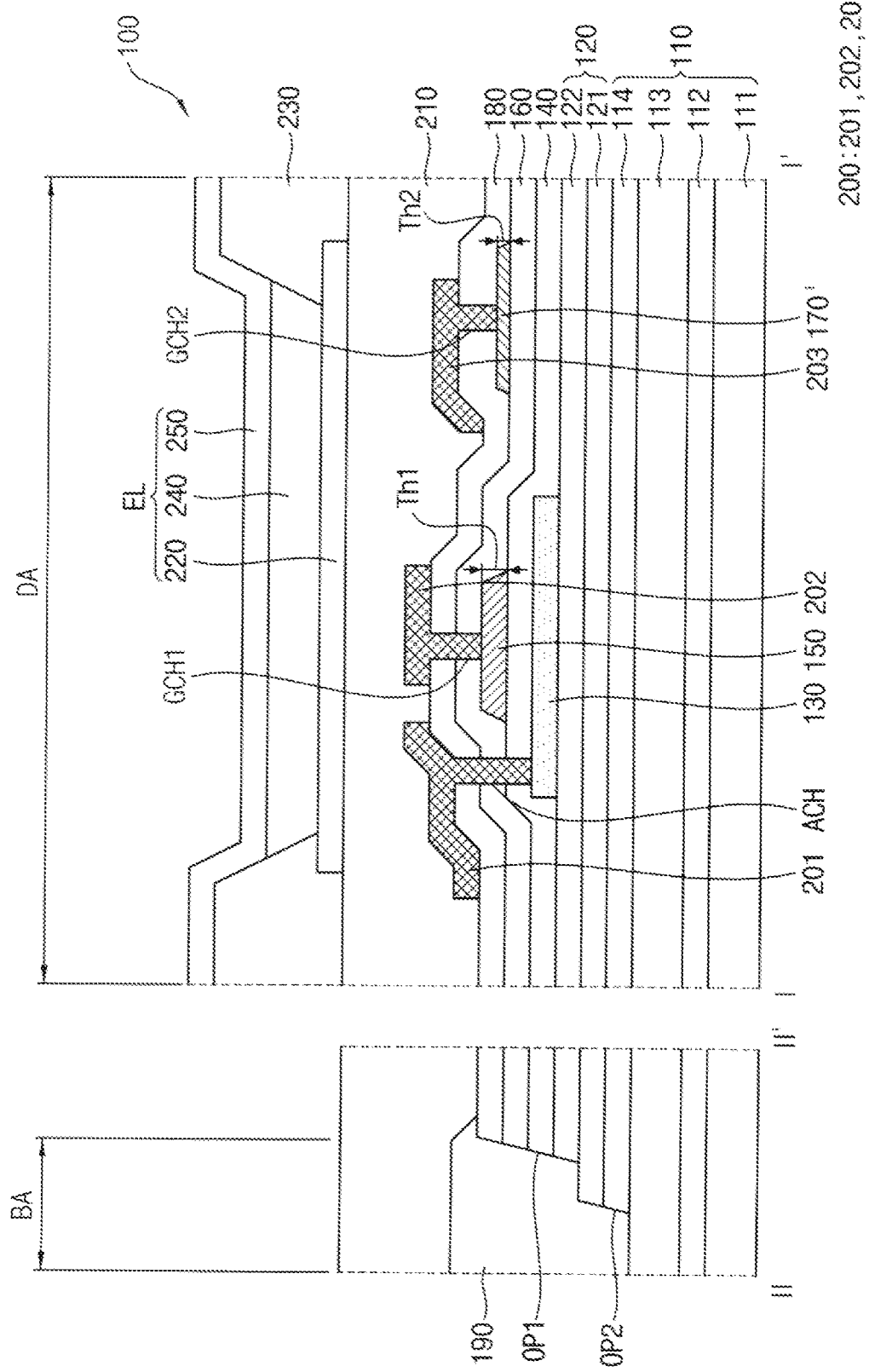
FIG. 5 is a cross-sectional view illustrating another embodiment of the display device taken along line I-I' and line II-II' in FIG. 1.

FIG. 5 is a cross-sectional view illustrating another embodiment of the display device 100 taken along line I-I' and line II-II' in FIG. 1.

Another embodiment of the display device described with reference to FIG. 5 may be substantially the same as or similar to the embodiment of the display device described with reference to FIG. 2 except for the thickness of the second gate line. Accordingly, descriptions on repeated elements will be omitted.

Referring to FIG. 5, in an embodiment, a thickness Th2 of the second gate line 170' may be less than a thickness Th1 of the first gate line 150. In an embodiment, the thickness Th1 of the first gate line 150 may be about 2500 Å, and the thickness Th2 of the second gate line 170' may be about 700 Å to about 800 Å, for example.

In an embodiment, an electrical resistance of the second gate line 170' may be substantially equal to an electrical resistance of the first gate line 150. A resistivity of aluminum (Al) included in the second gate line 170' is less than a resistivity of molybdenum (Mo) included in the first gate line 150, however, the thickness of the second gate line 170' may be less than the thickness of the first gate line 150, so that the electrical resistance of the second gate line 170' may be substantially equal to the electrical resistance of the first gate line 150.

Hereinafter, a display device in an embodiment will be described with reference to FIGS. 6 to 8.

Descriptions on elements of the display device 101 described with reference to FIGS. 6 to 8, which are substantially the same as or similar to those of the display device 100 described with reference to FIGS. 1 to 5, will not be repeated.

Figure 6:
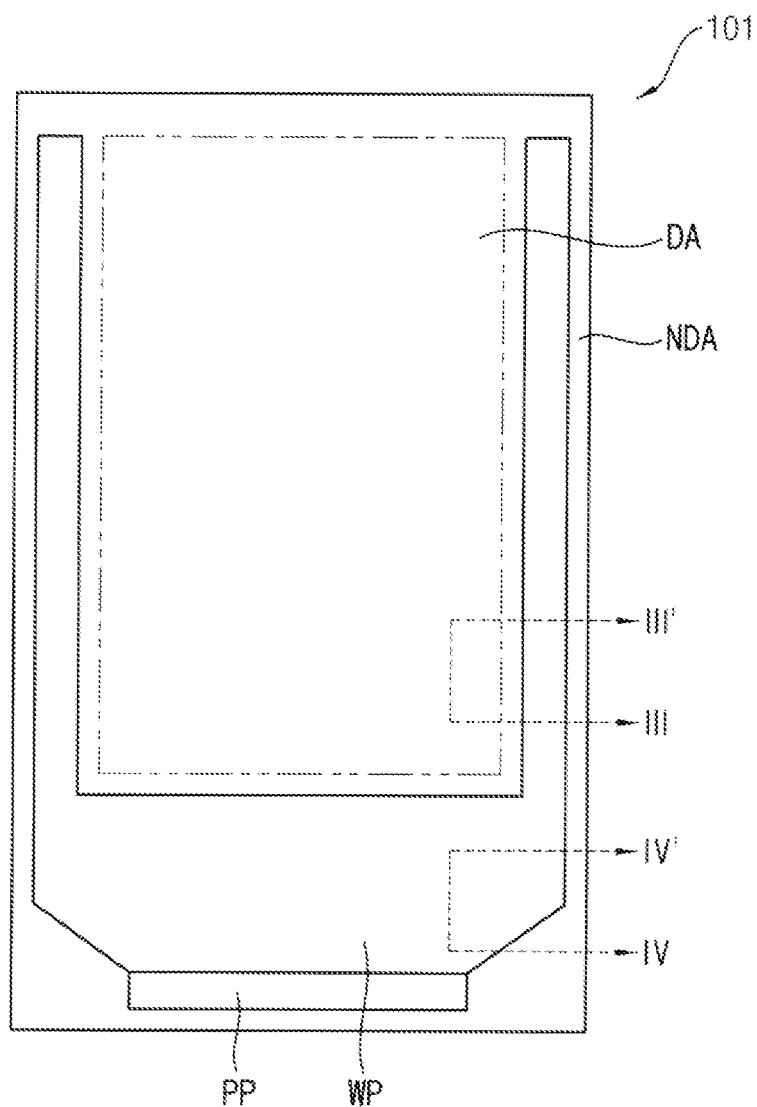
FIG. 6 is a plan view illustrating an embodiment of a display device.

FIG. 6 is a plan view illustrating an embodiment of a display device.

Referring to FIG. 6, a pad portion PP and a wiring portion WP may be disposed in the non-display area NDA. The pads for providing signals to the pixels that are disposed in the display area DA may be disposed in the pad portion PP, and the lines for connecting the pixels and the pads may be disposed in the wiring portion WP. The lines may transmit the signals from the pads to the pixels. The signals may include the data voltage, the first power voltage, the second power voltage, and various control signals.

Figure 7:
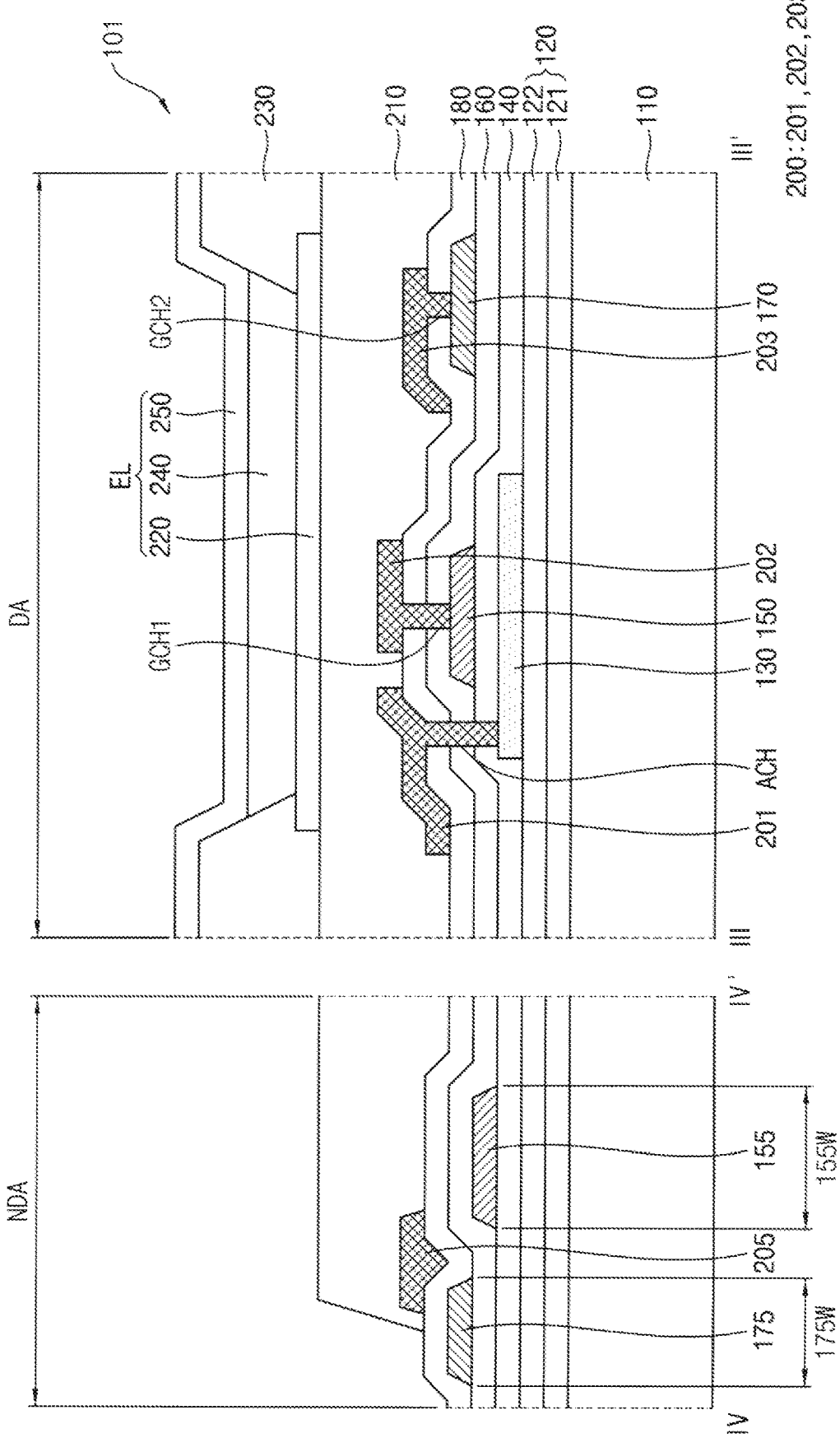
FIG. 7 is a cross-sectional view illustrating an embodiment of the display device taken along line III-III' and line IV-IV' in FIG. 6.

FIG. 7 is a cross-sectional view illustrating an embodiment of the display device 101 taken along line III-III' and line IV-IV' in FIG. 6.

Referring to FIG. 7, the display device 101 may include a base substrate 110, a buffer layer 120, an active layer 130, a first gate insulation layer 140, a first gate line 150, a first signal line 155, a second gate insulation layer 160, a second gate line 170, a second signal line 175, an inter-insulation layer 180, a conductive line 200, a third signal line 205, a planarization layer 210, a first electrode 220, a pixel defining layer 230, an emission layer 240, and a second electrode 250. The display device 101 described with reference to FIG. 7 may be substantially the same as or similar to the display device 100 described with reference to FIG. 2 except for the omission of the first opening OP1, the second opening OP2 and the stress relaxation layer 190, the addition of the first signal line 155, the second signal line 175 and the third signal line 205, and elements of the base substrate 110. Accordingly, descriptions on repeated elements will be omitted.

In an embodiment, the base substrate 110 may be a rigid substrate. In an embodiment, the base substrate 110 may include glass, quartz, metal, or the like. In such an embodiment, the display device 101 may be a rigid display device, for example.

The first signal line 155 may be disposed in the same layer as the first gate line 150 in the non-display area NDA, and may include the same material as that of the first gate line 150. In other words, the first signal line 155 may be disposed between the first gate insulation layer 140 and the second gate insulation layer 160, and may include molybdenum (Mo). In an embodiment, a conductive layer including molybdenum (Mo) may be disposed on the first gate insulation layer 140, and the conductive layer may be patterned to substantially simultaneously form the first gate line 150 and the first signal line 155, for example.

In an embodiment, the first signal line 155 may transmit a signal applied to at least one of the first gate line 150, the second gate line 170, and the conductive line 200. In an embodiment, the first signal line 155 may transmit at least one of the data voltage, the first power voltage, the second power voltage, and the control signals, for example.

The second signal line 175 may be disposed in the same layer as the second gate line 170 in the non-display area NDA, and may include the same material as that of the second gate line 170. In other words, the second signal line 175 may be disposed between the second gate insulation layer 160 and the insulation interlayer 180, and may include aluminum (Al) or an aluminum alloy. In an embodiment, a conductive layer including aluminum (Al) or an aluminum alloy may be disposed on the second gate insulation layer 160, and the conductive layer may be patterned to substantially simultaneously form the second gate line 170 and the second signal line 175, for example.

In an embodiment, a width 155W of the first signal line 155 may be greater than a width 175W of the second signal line 175. In an embodiment, the width 155W of the first signal line 155 may be about 5.0 micrometers (μm), and the width 175W of the second signal line 175 may be about 2.2 μm, for example. A resistivity of molybdenum (Mo) included in the first signal line 155 is greater than a resistivity of aluminum (Al) included in the second signal line 175, however, the width 155W of the first signal line 155 may be greater than the width 175W of the second signal line 175, so that the signal transmitted by the first signal line 155 may not be delayed.

The third signal line 205 may be disposed in the same layer as the conductive line 200 in the non-display area NDA, and may include the same material as that of the conductive line 200. In other words, the third signal line 205 may be disposed between the insulation interlayer 180 and the planarization layer 210, and may include aluminum (Al) and titanium (Ti). In an embodiment, a conductive layer including aluminum (Al) and titanium (Ti) may be disposed on the insulation interlayer 180, and the conductive layer may be patterned to substantially simultaneously form the conductive line 200 and the third signal line 205, for example.

Figure 8:
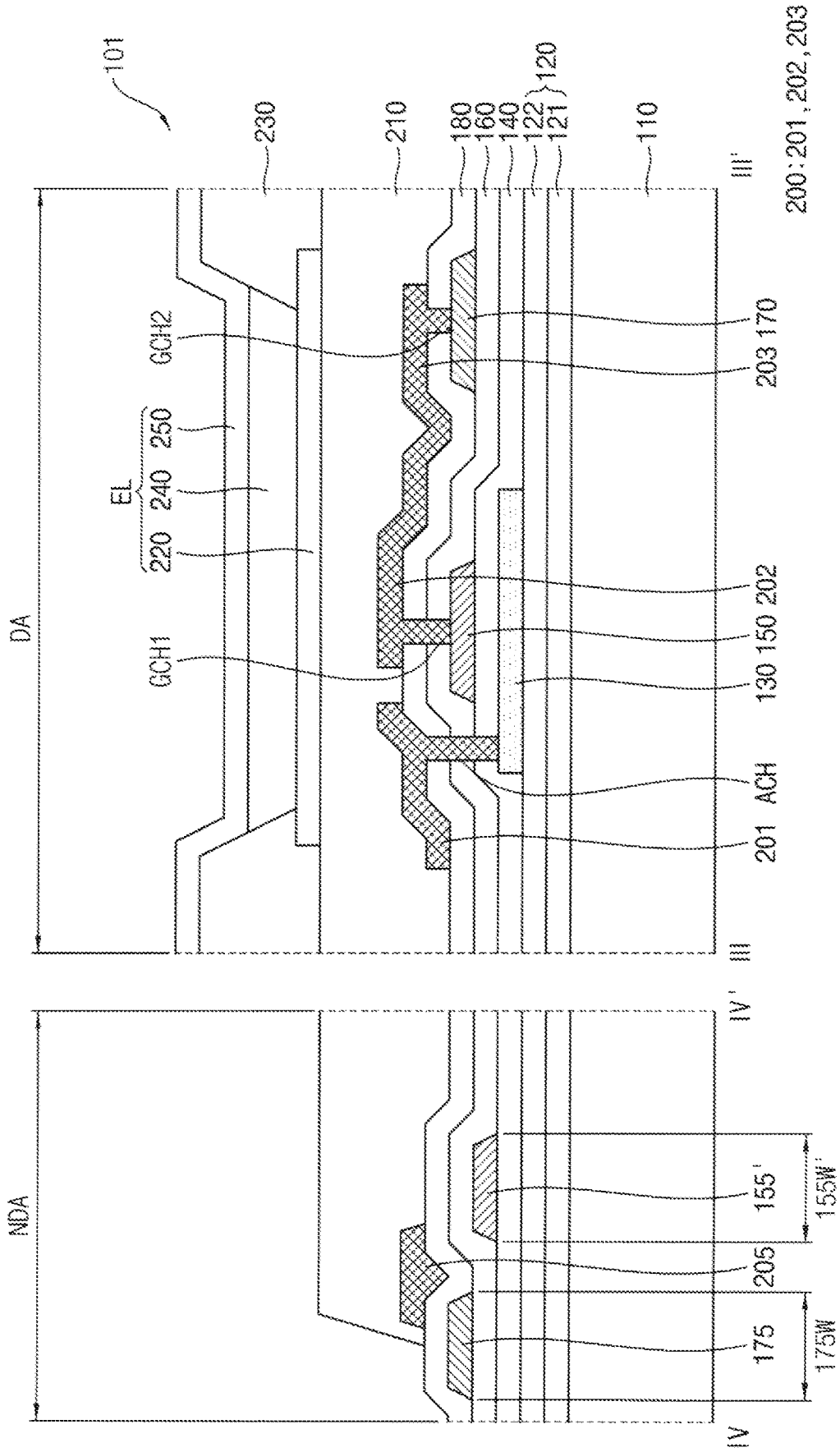
FIG. 8 is a cross-sectional view illustrating another embodiment of the display device taken along line III-III' and line IV-IV' in FIG. 6.

FIG. 8 is a cross-sectional view illustrating another embodiment of the display device 101 taken along line III-III' and line IV-IV' in FIG. 6.

Another embodiment of the display device described with reference to FIG. 8 may be substantially the same as or similar to the embodiment of the display device described with reference to FIG. 7 except for the width of the first signal line. Accordingly, descriptions on repeated elements will be omitted.

Referring to FIG. 8, in an embodiment, a width 155W' of the first signal line 155' may be substantially equal to a width 175W of the second signal line 175. In an embodiment, each of the width 155W' of the first signal line 155' and the width 175W of the second signal line 175 may be about 2.2 μm, for example.

In an embodiment, the third signal line 205 may transmit a signal applied to at least one of the first gate line 150, the second gate line 170, and the conductive line 200. In an embodiment, the third signal line 205 may transmit at least one of the data voltage, the first power voltage, the second power voltage, and the control signals, for example.

Hereinafter, a method of manufacturing a display device in an embodiment will be described with reference to FIGS. 9 to 15.

FIGS. 9, 10, 11, 12, 13, 14, and 15 are cross-sectional views illustrating an embodiment of a method of manufacturing a display device. In an embodiment, FIGS. 9 to 15 may illustrate a method of manufacturing the display device 100 described with reference to FIGS. 1 to 5.

Figure 9:
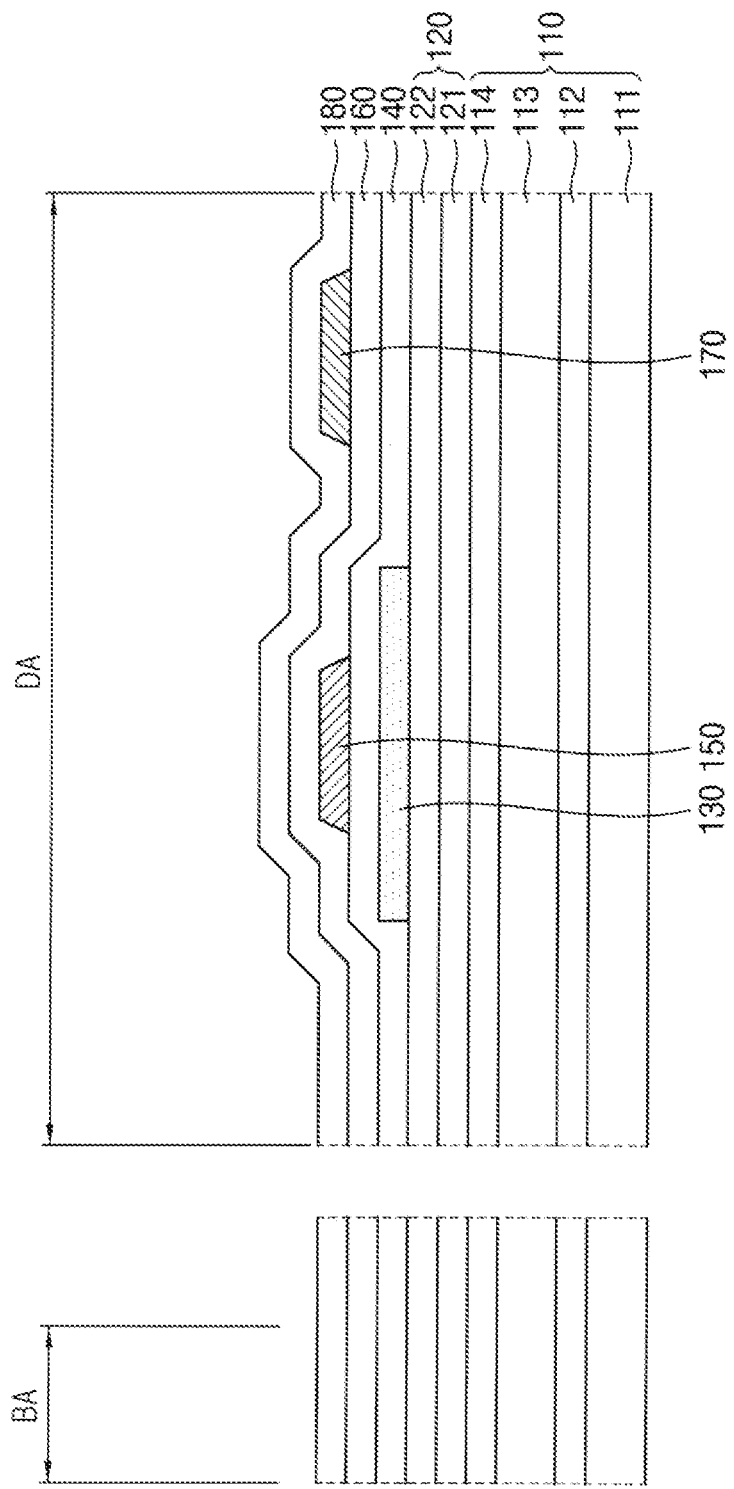
FIGS. 9, 10, 11, 12, 13, 14, and 15 are cross-sectional views illustrating an embodiment of a method of manufacturing a display device.

Referring to FIG. 9, the buffer layer 120, the active layer 130, the first gate insulation layer 140, the first gate line 150, the second gate insulation layer 160, the second gate line 170, and the insulation interlayer 180 may be sequentially disposed on the base substrate 110.

First, the buffer layer 120 may be disposed on the base substrate 110. In an embodiment, the base substrate 110 may include the first organic layer 111, the first barrier layer 112 disposed on the first organic layer 111, the second organic layer 113 disposed on the first barrier layer 112, and the second barrier layer 114 disposed on the second organic layer 113. In an embodiment, the buffer layer 120 may include the first buffer layer 121 and the second buffer layer 122 disposed on the first buffer layer 121.

Then, the active layer 130 may be disposed on the buffer layer 120, and the first gate insulation layer 140 may be disposed on the active layer 130. The active layer 130 may be disposed in the display area DA.

Then, the first gate line 150 may be disposed on the first gate insulation layer 140, the second gate insulation layer 160 may be disposed on the first gate line 150, and the second gate line 170 may be disposed on the second gate insulation layer 160. The first gate line 150 and the second gate line 170 may be disposed in the display area DA. In an embodiment, the first gate line 150 may include molybdenum (Mo), and the second gate line 170 may include aluminum (Al) or an aluminum alloy.

Then, the insulation interlayer 180 may be disposed on the second gate line 170.

Figure 10:
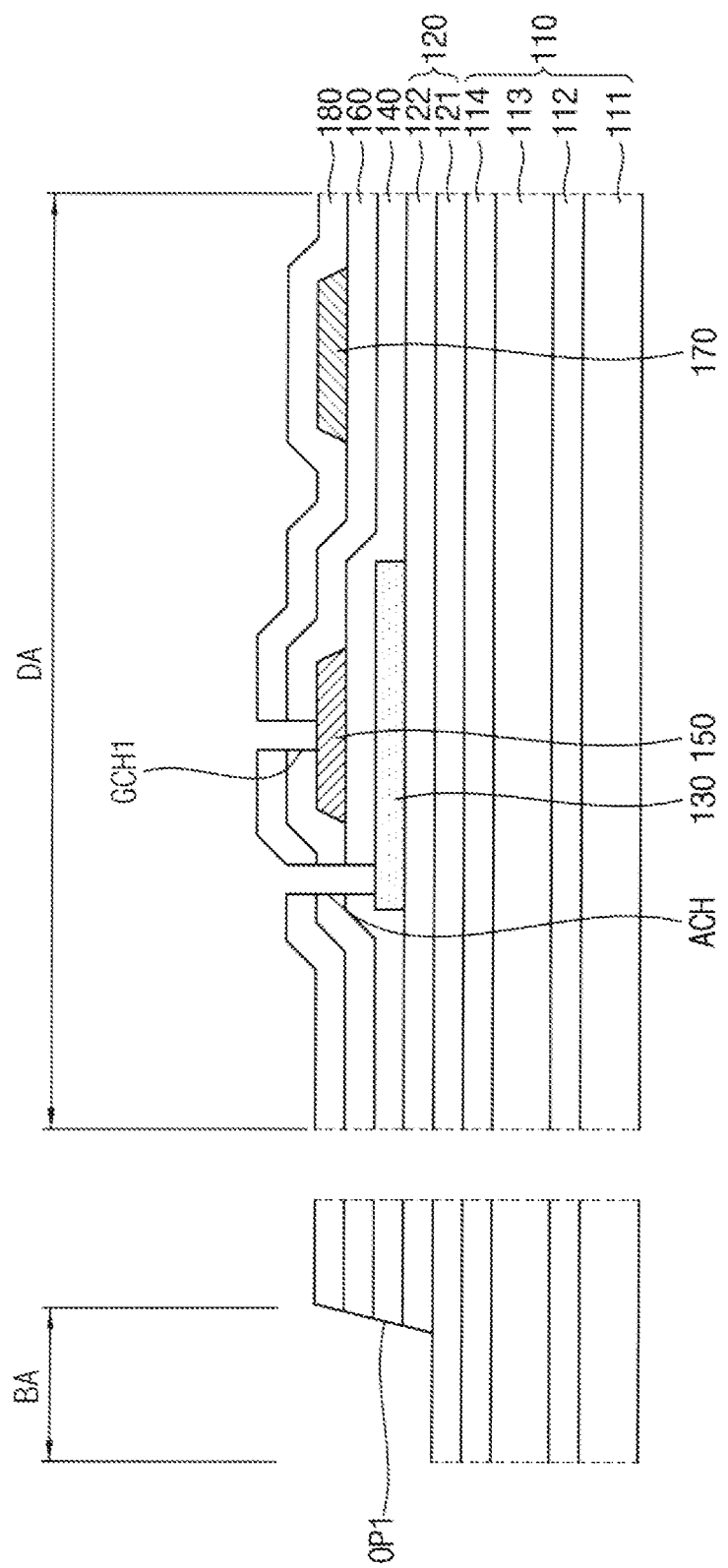

Referring to FIG. 10, the active contact hole ACH exposing the active layer 130 may be defined in the insulation interlayer 180, the second gate insulation layer 160, and the first gate insulation layer 140, the first gate contact hole GCH1 exposing the first gate line 150 may be defined in the insulation interlayer 180 and the second gate insulation layer 160, and the first opening OP1 overlapping the bendable area BA may be defined in the insulation interlayer 180, the second gate insulation layer 160, the first gate insulation layer 140, and a first portion of the buffer layer 120. The active contact hole ACH, the first gate contact hole GCH1, and the first opening OP1 may be substantially simultaneously defined.

In an embodiment, the first portion of the buffer layer 120 may be the second buffer layer 122. In other words, the first opening OP1 may be defined in the insulation interlayer 180, the second gate insulation layer 160, the first gate insulation layer 140, and the second buffer layer 122.

Figure 11:
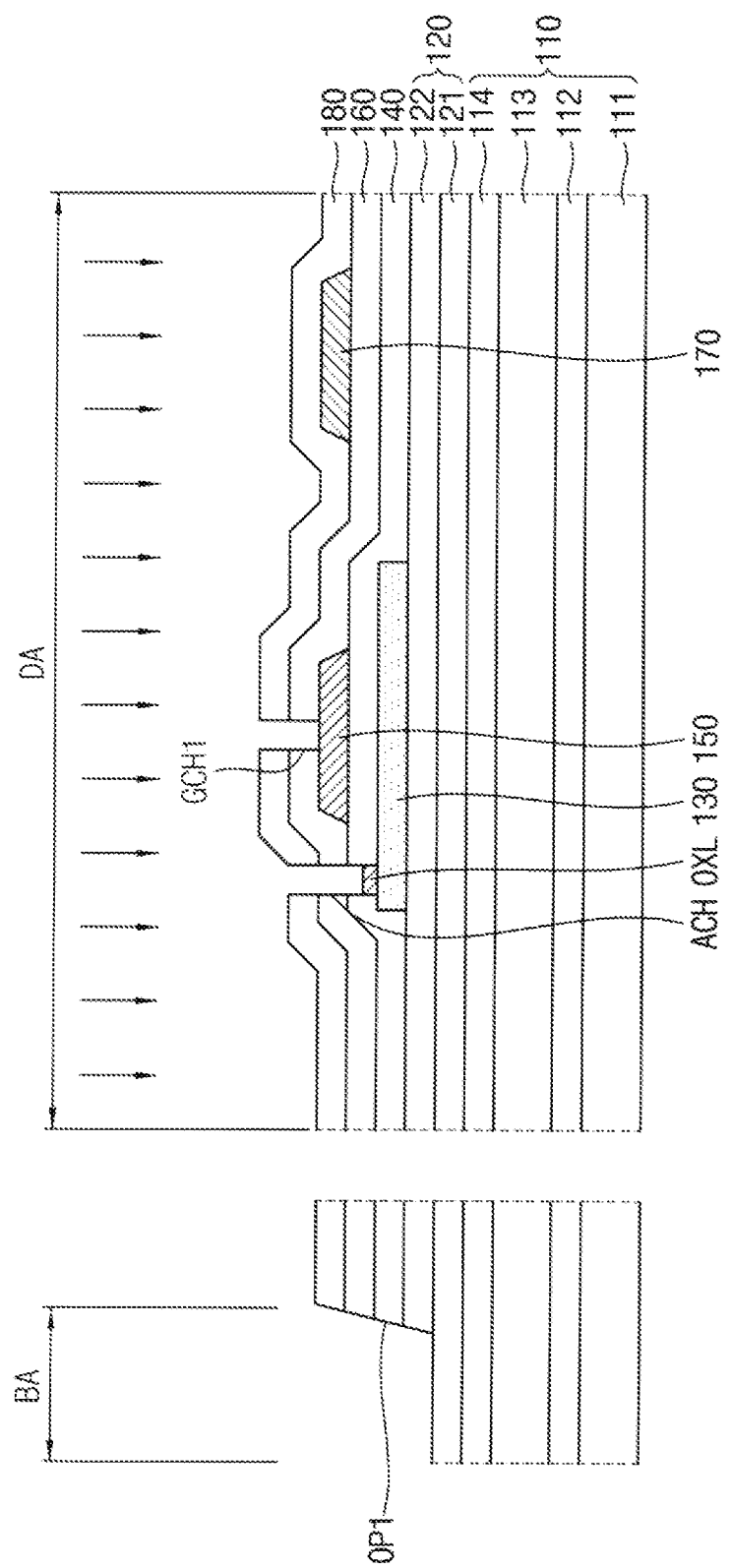

Referring to FIG. 11, after substantially simultaneously defining the active contact hole ACH, the first gate contact hole GCH1, and the first opening OP1, the active layer 130 may be heat-treated. When the active layer 130 is heat-treated, electrical characteristics of at least one TFT provided by the active layer 130 and the first gate line 150 and electrical characteristics of at least one TFT provided by the active layer 130 and the second gate line 170 may be improved. In an embodiment, when the TFTs include a driving TFT and a switching TFT, by the heat-treatment of the active layer 130, a driving range of the driving TFT may be widened, and a deviation of a threshold voltage of the switching TFT may decrease.

An oxide layer OXL may be disposed on the active layer 130 in the process of heat-treating the active layer 130. In an embodiment, in the process of heat-treating the active layer 130, oxygen ions may react with an upper surface of the active layer 130 exposed by the active contact hole ACH to form the oxide layer OXL, for example.

Figure 12:
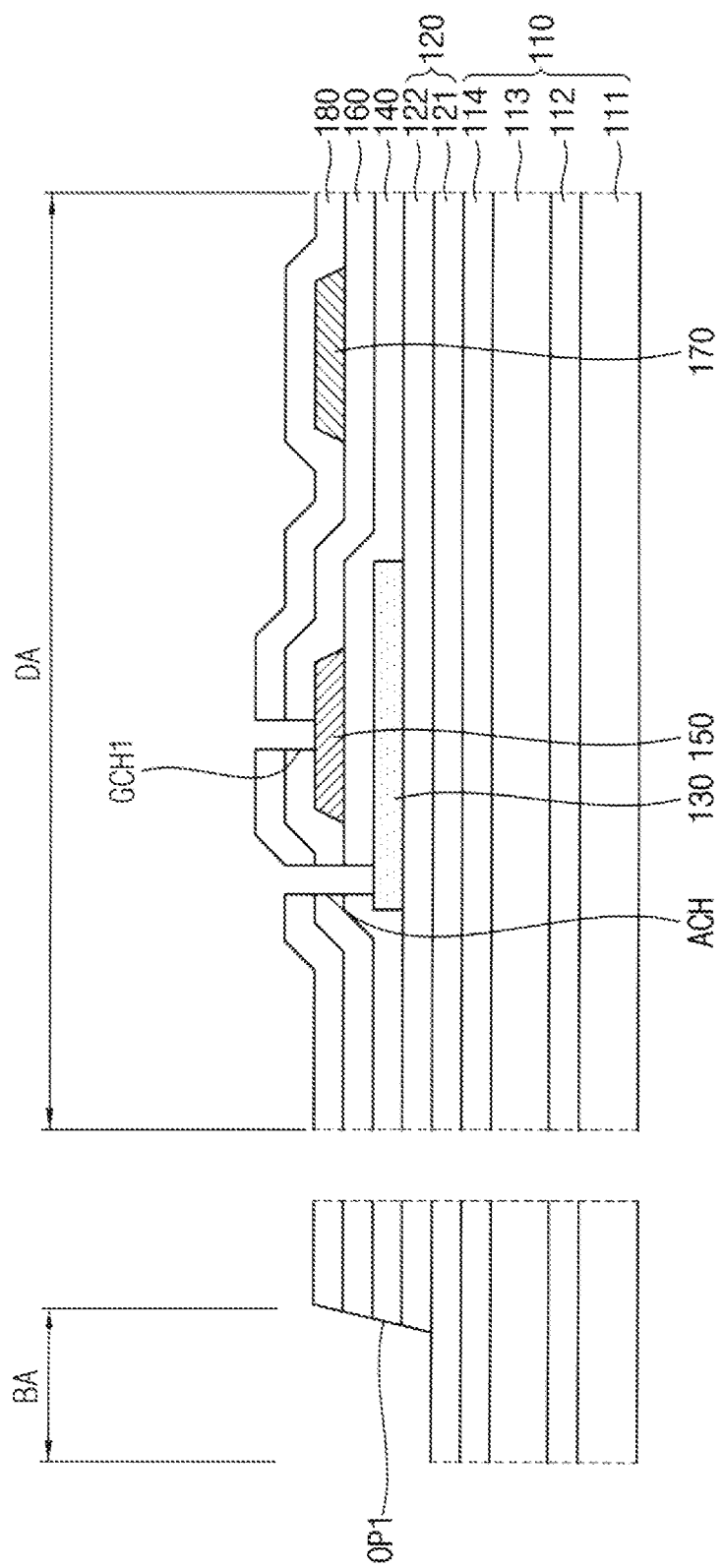

Referring to FIG. 12, the oxide layer OXL disposed on the active layer 130 by the heat-treatment may be removed. In an embodiment, the oxide layer OXL may be removed with a buffered oxide etchant ("BOE") or hydrogen fluoride ("HF").

Figure 13:
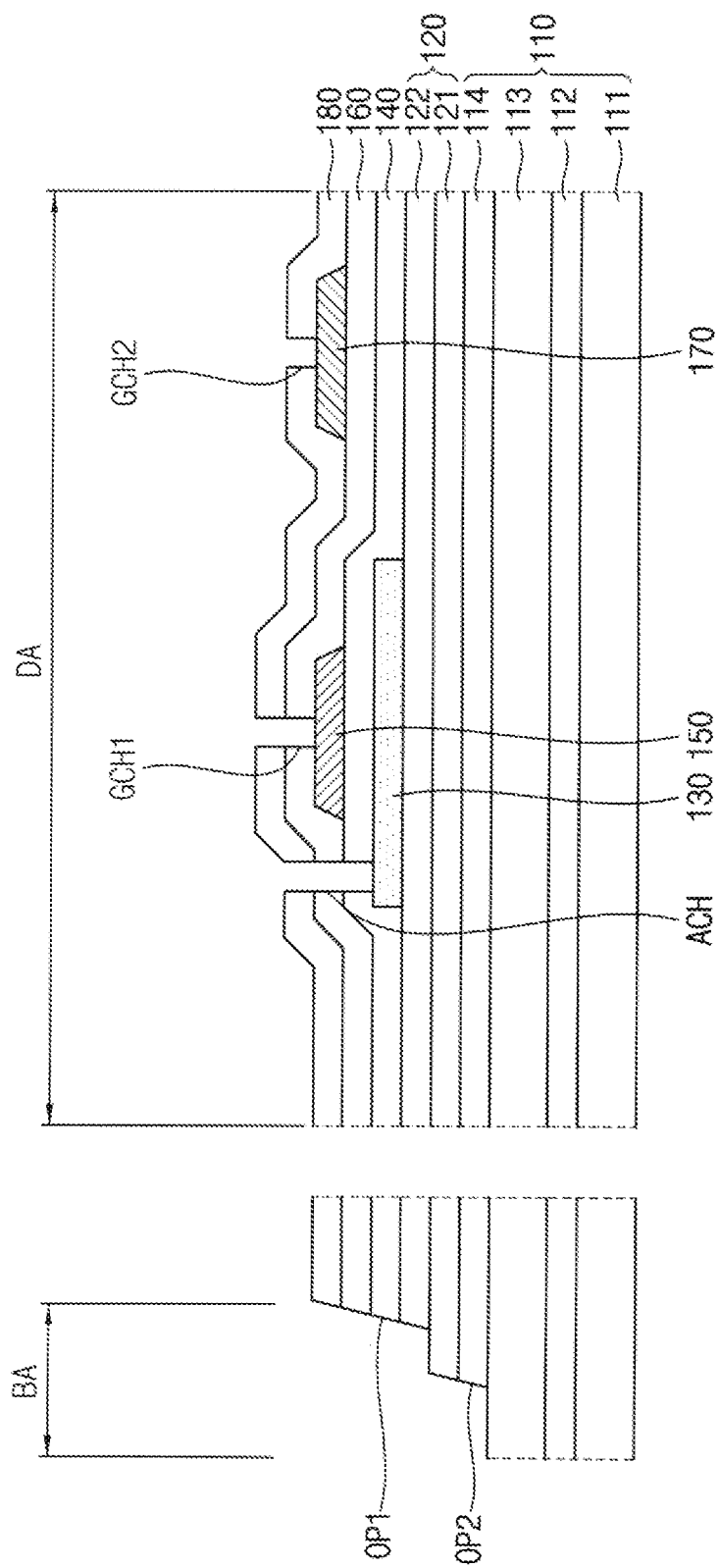

Referring to FIG. 13, the second gate contact hole GCH2 exposing the second gate line 170 may be defined in the insulation interlayer 180, and the second opening OP2 overlapping the bendable area BA may be defined in a second portion of the buffer layer 120 and a portion of the base substrate 110. The second gate contact hole GCH2 and the second opening OP2 may be substantially simultaneously defined.

In an embodiment, the second portion of the buffer layer 120 may be the first buffer layer 121, and the portion of the base substrate 110 may be the second barrier layer 114. In other words, the second opening OP2 may be defined in the first buffer layer 121 and the second barrier layer 114.

In the prior art, after substantially simultaneously defining the active contact hole ACH, the first gate contact hole GCH1, the second gate contact hole GCH2, and the first opening OP1, the oxide layer OXL disposed in the active contact hole ACH may be removed with BOE or HF. In the prior art, the second gate line 170 exposed by the second gate contact hole GCH2 may be damaged by BOE or HF.

In the embodiments of the invention, after removing the oxide layer OXL disposed in the active contact hole ACH with BOE or HF, the second gate contact hole GCH2 may be defined, so that the second gate line 170 exposed by the second gate contact hole GCH2 may not be damaged by BOE or HF. Further, since the second gate contact hole GCH2 is substantially simultaneously defined with the second opening OP2, an additional process for defining the second opening OP2 may not be desired.

Figure 14:
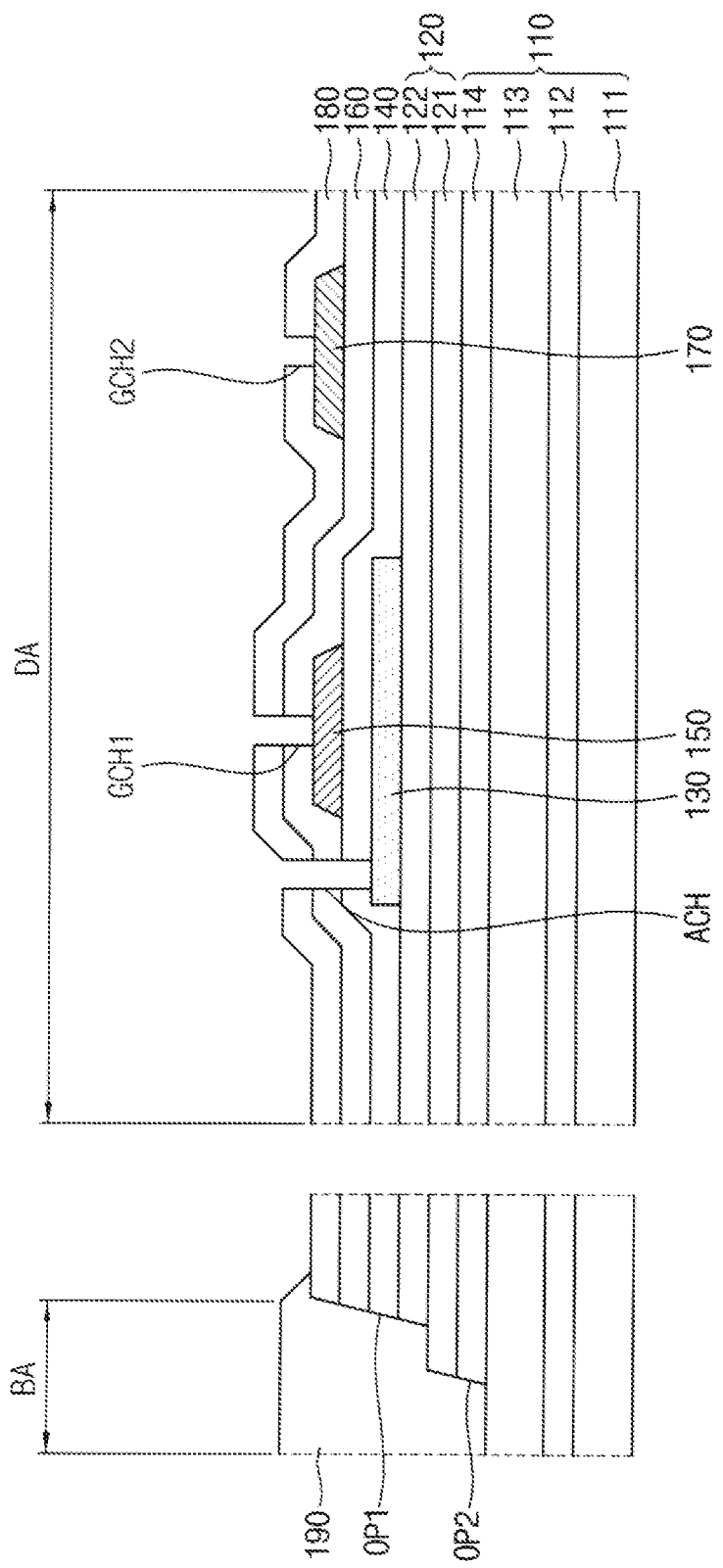

Referring to FIG. 14, the stress relaxation layer 190 may be disposed on the insulation interlayer 180 in the bendable area BA. The stress relaxation layer 190 may fill the first opening OP1 and the second opening OP2.

Figure 15:
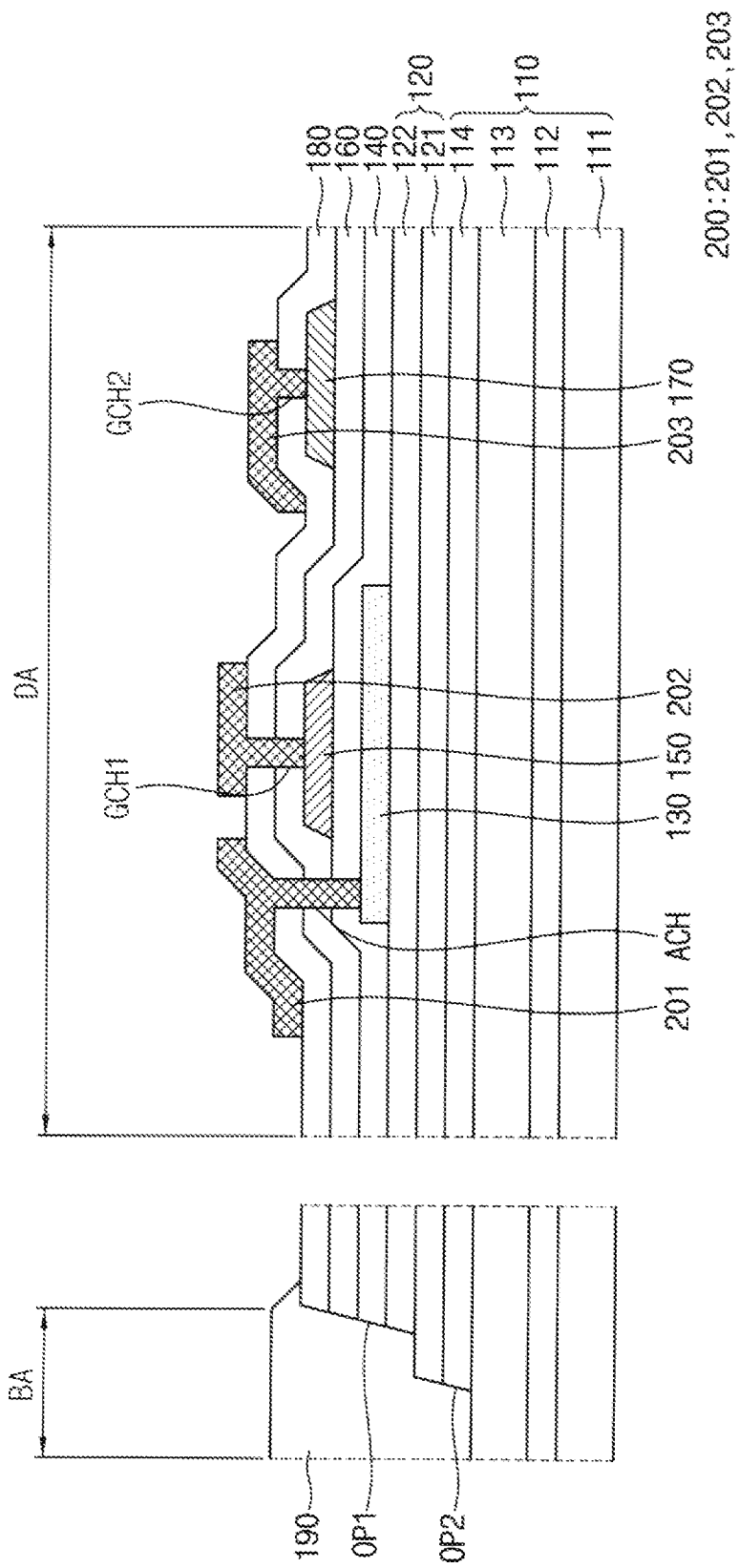

Referring to FIG. 15, the conductive line 200 may be disposed on the insulation interlayer 180 in the display area DA. The conductive line 200 may be connected to the active layer 130 through the active contact hole ACH, may be connected to the first gate line 150 through the first gate contact hole GCH1, and may directly contact the second gate line 170 through the second gate contact hole GCH2.

Figure 16:
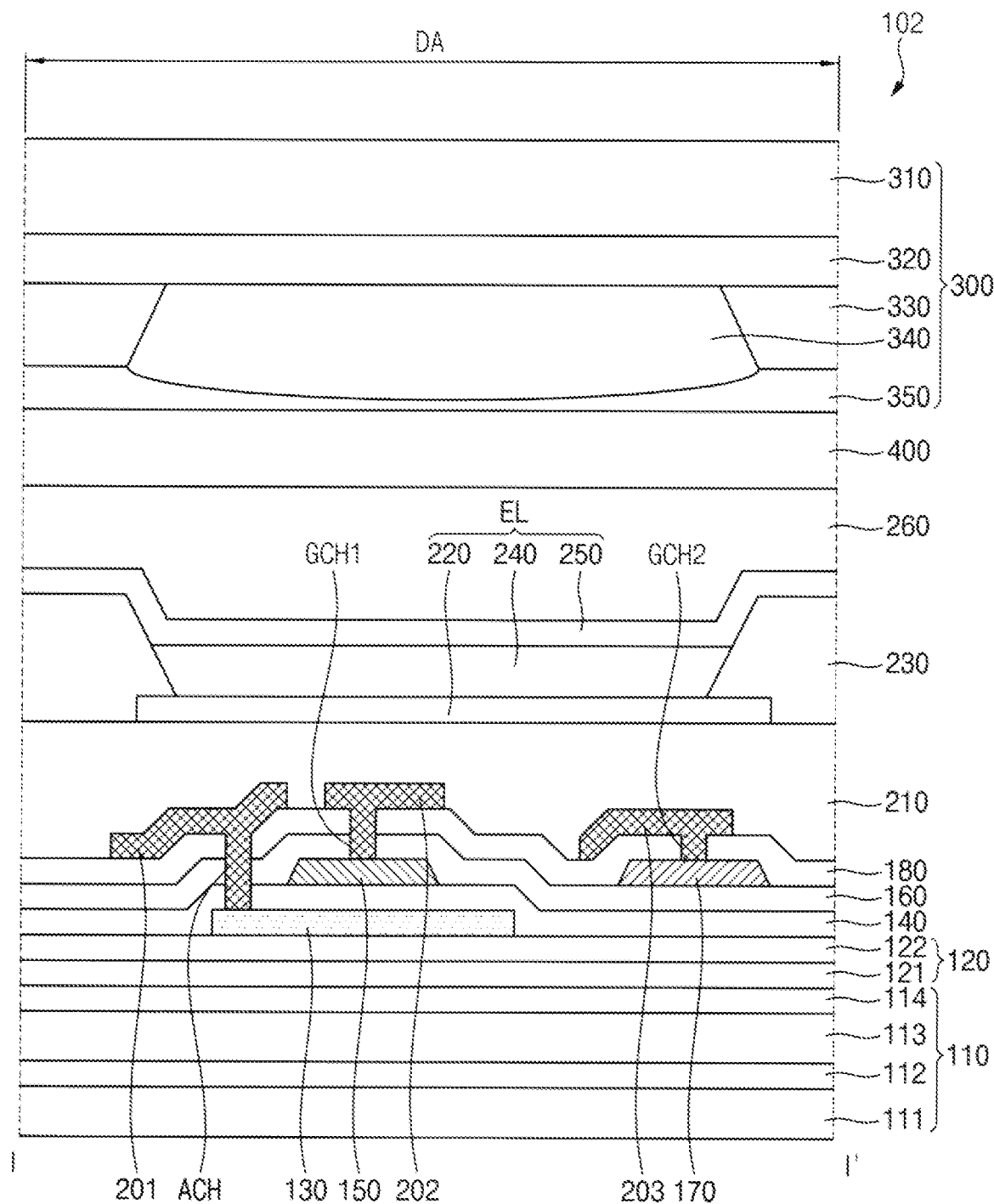
FIG. 16 is a cross-sectional view illustrating an embodiment of a display device.

FIG. 16 is a cross-sectional view illustrating an embodiment of a display device.

The display device 102 described with reference to FIG. 16 may be substantially the same as or similar to the display device 100 described with reference to FIGS. 2 to 4 except for the addition of an encapsulation layer 260, a color conversion member 300, and a filling layer 400. Accordingly, descriptions on repeated elements will be omitted.

Referring to FIG. 16, the display device 102 may further include an encapsulation layer 260, a color conversion member 300, and a filling layer 400.

The encapsulation layer 260 may be disposed on the second electrode 250. The encapsulation layer 260 may include at least one inorganic encapsulation layer and at least one organic encapsulation layer. In an embodiment, the encapsulation layer 260 may have a structure in which a first inorganic encapsulation layer, an organic encapsulation layer, and a second inorganic encapsulation layer are sequentially stacked.

The color conversion member 300 may be disposed on the encapsulation layer 260. The color conversion member 300 may receive light from the light emitting element EL, and may convert a color of the light or transmit the light. In an embodiment, the color conversion member 300 may receive blue light from the light emitting element EL, and may convert the blue light into red light or green light, or transmit the blue light. The color conversion member 300 may include a substrate 310, a color filter 320, a partition wall 330, an optical filter 340, and a planarization layer 350.

The substrate 310 may be a transparent insulation substrate. In an embodiment, the substrate 310 may include glass, plastic, quartz, or the like, for example.

The color filter 320 may be disposed under the substrate 310. The color filter 320 may selectively transmit light of a predetermined wavelength band. The color filter 320 may be provided as an organic material pattern including a dye or pigment.

The optical filter 340 may be disposed under the color filter 320. The optical filter 340 may be provided with an inkjet manner in a space defined by the partition wall 330. The optical filter 340 may convert a color of light incident on the optical filter 340 or transmit the light. In an embodiment, the optical filter 340 may convert blue light incident on the optical filter 340 into red light or green light or transmit the blue light.

The partition wall 330 may be disposed under the color filter 320, and may surround the optical filter 340. The partition wall 330 may overlap the pixel defining layer 230. The partition wall 330 may have a reverse-tapered cross-sectional shape in which a width of the partition wall 330 decreases as distancing from the substrate 310.

The planarization layer 350 may be disposed under the partition wall 330 and the optical filter 340. In an embodiment, the planarization layer 350 may include an inorganic insulation material such as silicon nitride and/or silicon oxide. In another embodiment, the planarization layer 350 may include an organic insulation material such as polyimide resin, acrylic resin, or the like.

The filling layer 400 may be disposed between the encapsulation layer 260 and the color conversion member 300. The filling layer 400 may include a photocurable epoxy-based material, an acrylate-based material, or the like. The color conversion member 300 may be provided separately from the encapsulation layer 260 on the base substrate 110, and then may be combined to the encapsulation layer 260 with the filling layer 400 interposed therebetween.

Figure 17:
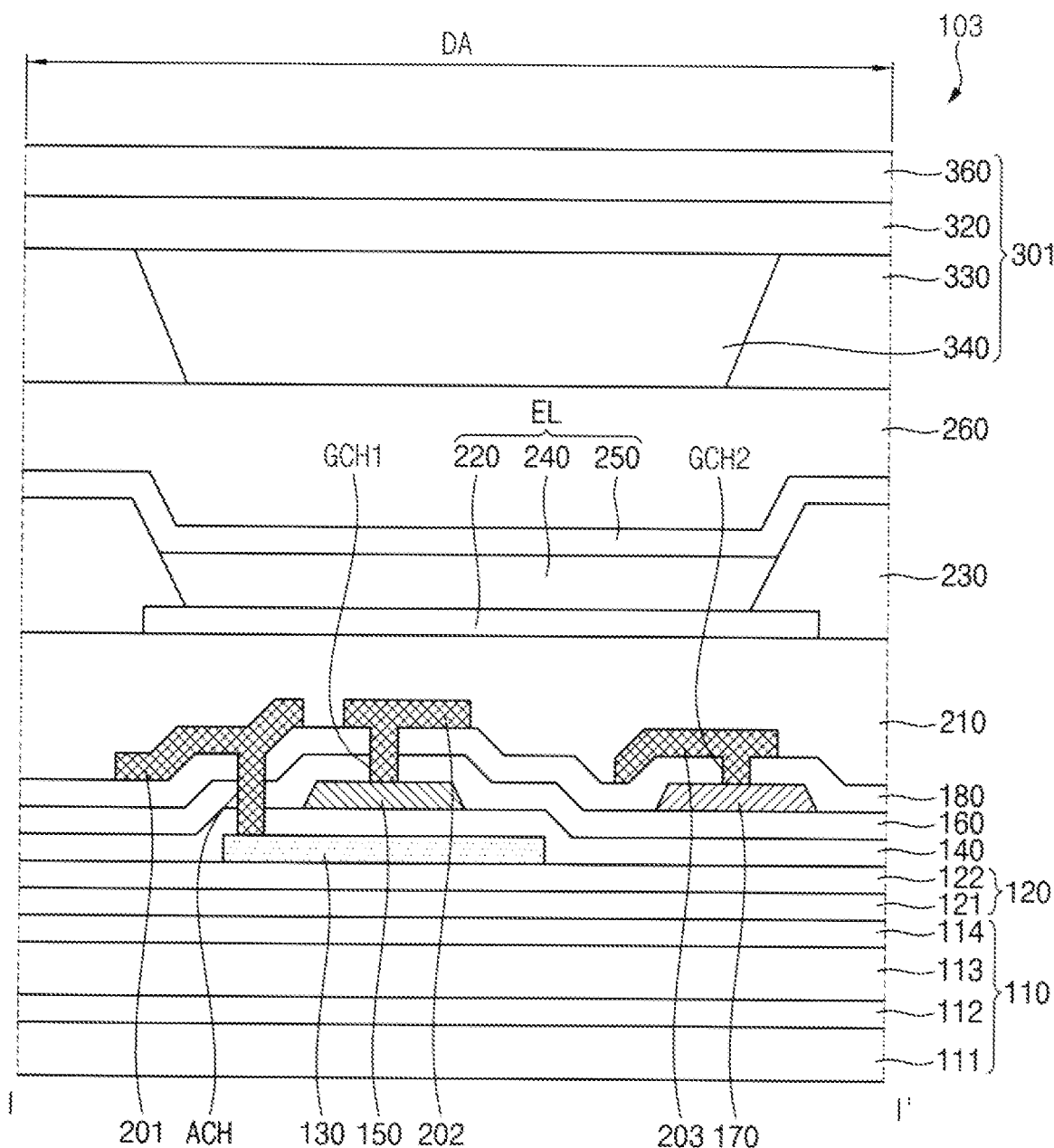
FIG. 17 is a cross-sectional view illustrating an embodiment of a display device.

FIG. 17 is a cross-sectional view illustrating an embodiment of a display device.

Descriptions on elements of the display device 103 described with reference to FIG. 17, which are substantially the same as or similar to those of the display device 102 described with reference to FIG. 16, will not be repeated.

Referring to FIG. 17, the display device 103 may include a color conversion member 301. The color conversion member 301 may include a color filter 320, a partition wall 330, an optical filter 340, and a cover layer 360.

The optical filter 340 may be disposed on the encapsulation layer 260. The partition wall 330 may be disposed on the encapsulation layer 260, and may surround the optical filter 340. The partition wall 330 may have a forward-tapered cross-sectional shape in which a width of the partition wall 330 decreases as distancing from the encapsulation layer 260. The color filter 320 may be disposed on the partition wall 330 and the optical filter 340.

The cover layer 360 may be disposed on the color filter 320. The cover layer 360 may protect the color filter 320, the partition wall 330, and the optical filter 340. The cover layer 360 may include a high-hardness polymer material such as siloxane or the like.

The color conversion member 301 may be disposed on the encapsulation layer 260. Specifically, the partition wall 330, the optical filter 340, the color filter 320, and the cover layer 360 may be sequentially disposed on the encapsulation layer 260.

The display device in the embodiments may be applied to a display device included in a computer, a notebook, a mobile phone, a smartphone, a smart pad, a portable media player ("PMP"), a personal digital assistance ("PDA"), an MP3 player, or the like.

Although the display devices and the methods of manufacturing the display devices in the embodiments have been described with reference to the drawings, the illustrated embodiments are examples, and may be modified and changed by a person having ordinary knowledge in the relevant technical field without departing from the technical spirit of the invention.

What is claimed is:

1. A method of manufacturing a display device, the method comprising:

forming a buffer layer on a base substrate;

forming an active layer on the buffer layer;

forming a first gate insulation layer on the active layer;

forming a first gate line on the first gate insulation layer, the first gate line including molybdenum;

forming a second gate insulation layer on the first gate line;

forming a second gate line on the second gate insulation layer, the second gate line including aluminum or an aluminum alloy;

forming an insulation interlayer on the second gate line;

simultaneously defining an active contact hole which exposes the active layer in the insulation interlayer, the second gate insulation layer, and the first gate insulation layer, a first gate contact hole which exposes the first gate line in the insulation interlayer and the second gate insulation layer, and a first opening which overlaps a bendable area in the insulation interlayer, the second gate insulation layer, the first gate insulation layer, and a first portion of the buffer layer; and simultaneously defining a second gate contact hole which exposes the second gate line in the insulation interlayer and a second opening which overlaps the bendable area in a second portion of the buffer layer and a portion of the base substrate.

2. The method of claim 1, further comprising:

after the simultaneously defining the active contact hole, the first gate contact hole, and the first opening and before the simultaneously defining the second gate contact hole and the second opening, heat-treating the active layer such that an oxide layer is formed on the active layer; and removing the oxide layer formed on the active layer by the heat-treatment.

3. The method of claim 2, wherein the oxide layer is removed by a buffered oxide etchant or hydrogen fluoride.

4. The method of claim 1, further comprising:

forming a conductive line on the insulation interlayer, the conductive line including aluminum and titanium, wherein the conductive line is connected to the active layer through the active contact hole, directly contacts the first gate line through the first gate contact hole, and directly contacts the second gate line through the second gate contact hole.

* * * * *